United States Patent [19]

Blanchard

[11] Patent Number: 4,851,366
[45] Date of Patent: Jul. 25, 1989

[54] METHOD FOR PROVIDING DIELECTRICALLY ISOLATED CIRCUIT

[75] Inventor: Richard A. Blanchard, Los Altos, Calif.

[73] Assignee: Siliconix Incorporated, Calif.

[21] Appl. No.: 120,343

[22] Filed: Nov. 13, 1987

[51] Int. Cl.⁴ .................................. H01L 21/76
[52] U.S. Cl. ............................ 437/61; 437/64; 437/67; 437/78; 437/90; 437/86; 437/228; 437/239; 437/974; 437/978; 437/72; 148/DIG. 50
[58] Field of Search ............... 437/61, 64, 67, 78, 437/90, 72, 86, 228, 239, 974, 978

[56] References Cited

U.S. PATENT DOCUMENTS

| | | | |
|---|---|---|---|
| 3,423,255 | 1/1969 | Joyce | 437/62 |
| 3,738,883 | 6/1973 | Bean et al. | 156/649 |
| 3,832,247 | 8/1974 | Saddler et al. | 437/57 |
| 3,913,121 | 10/1973 | Youmans et al. | 357/49 |
| 4,004,046 | 1/1977 | Price | 437/7 |
| 4,056,414 | 11/1977 | Kopp | 437/62 |
| 4,501,060 | 2/1985 | Frye et al. | 437/62 |

OTHER PUBLICATIONS

Brassington et al., IEEE Trans. on Electron Devices, "A Comparison of Fine-Dimension Silicon-on-Sapphire and Bulk-Silicon Complementary MOS Devices and Circuits" (Sep. 1985), pp. 1858-1867.
Partridge, IEDM 86, "The Current Status of Silicon-on-Insulator Technologies-A Comparison" (1986), pp. 428-430.
Ohashi et al., IEDM 86, "Improved Dielectrically Isolated Device Integration by Silicon-Wafer Direct Bonding (SDB) Technique" (1986), pp. 210-213.
Nakagawa et al., IEDM 86, "1800V Bipolar-Mode MOSFETs: A First Application of Silicon Wafer Direct Bonding (SDB) Technique to a Power Device" (1986).
Frye et al., J. Electrochem. Soc., "A Field-Assisted Bonding Process for Silicon Dielectric Isolation" (Aug. 1986), pp. 1673-1677.
Ohata and Izumita, IEEE 1987 Custom Integrated Circuits Conferences, "Dielectrically Isolated Intelligent Power Switch" (1987), pp. 443-446.

Primary Examiner—Brian E. Hearn
Assistant Examiner—Beverly A. Pawlikowski
Attorney, Agent, or Firm—Steven F. Caserza

[57] ABSTRACT

A novel process and structure is taught which provides discrete semiconductor islands located in a semiconductor substrate, the islands being electrically isolated from each other. Certain of these islands, in addition to being electrically isolated from other islands, are also electrically isolated from the substrate. Yet other ones of these islands are electrically isolated from other islands, but are electrically connected to the substrate. In accordance with the teachings of this invention, a substrate is used and a layer of electrical insulation is formed over only a portion of the surface of the substrate. Grooves are then formed to serve as vertical isolation regions. The grooves are filled with a non-conductive material, or covered with a layer of insulation on their sides and bottom, and filled with any convenient material, such as polycrystalline silicon. A second semiconductor substrate is then bonded to the first, and serves as the ultimate substrate of the finished device. The surface of the first substrate opposite said second substrate is etched to the vertical grooves, thereby providing a surface having vertical grooves serving as vertical isolation. The insulation layer formed on the surface of the first substrate serves as isolation between the islands and second substrate, a while the absence of such insulation layer causes certain other islands to be electrically connected to the second substrate.

12 Claims, 2 Drawing Sheets

METHOD FOR PROVIDING DIELECTRICALLY ISOLATED CIRCUIT

BACKGROUND OF THE INVENTION

This invention is related to the manufacture of integrated circuits and specifically the process of fabricating discrete semiconductor islands in a substrate which are electrically isolated from each other, some of which are electrically isolated from the substrate, and some of which are electrically connected to the substrate. This invention also pertains to the resulting structure.

DESCRIPTION OF THE PRIOR ART

During the manufacture of integrated circuits, semiconductor elements are often isolated from each other by a process known as "junction isolation". Junction isolation is used in both MOS and bipolar circuits to electrically isolate circuit elements. Under normal applications, junction isolation is usually an acceptable means to obtain circuit isolation. However, under adverse conditions such as in a radiation environment or under extreme high voltages, junction isolation is not effective and leads to circuit failure.

There are integrated circuits produced by separating circuit elements with vertical dielectric layers. An additional horizontal dielectric layer under the elements leads to a dielectrically isolated semiconductor region.

Such prior art techniques for providing dielectrically isolated semiconductor regions are described, for example, in U.S. Pat. Nos. 4,501,060; 4,056,414; 4,004,046; 3,423,255; 3,832,247; 3,738,883; and 3,913,121.

Silicon-on-sapphire processes are also used to provide dielectrically isolated semiconductor regions, but have performance limitations due to the degradation of electrical properties in comparison to dielectrically isolated silicon. Silicon-on-sapphire processes are described, for example, in "A Comparison of FineDimension Silicon-on-Sapphire and Bulk-Silicon Complementary MOS Devices and Circuits", Brassington et al., IEEE Transactions on Electron Devices Vol. ED-32, No. 9, September, 1985, pages 1858-1867, and "The Current Status of Silicon-on-Insulator Technologies—A Comparison", S. L. Partridge, International Electron Device Meeting, 1986, pages 428-430.

Another prior art technique is called SIMOX. In the SIMOX process, oxygen atoms are implanted with high energy into a silicon substrate in order to place silicon atoms horizontally at a selected depth in the silicon substrate. A subsequent heat treatment causes these oxygen atoms to combine with the silicon substrate in order to form a horizontal layer of silicon dioxide insulator. However, a disadvantage of the SIMOX process is severe dislocations within the silicon substrate due to the high energy implantation of oxygen. Another disadvantage is the horizontal dielectric layer generated by the oxygen implant can be only thousands of angstroms in thickness, limiting the isolation to lower electrical voltages.

Another prior art process for forming electrically isolated silicon regions is the zone melt refining (ZMR) process. In ZMR, a polycrystalline layer is deposited on an electrical insulator and an attempt is made to transform the polycrystalline into a monocrystalline silicon layer, for example, by heat treatment using a laser. However, the ZMR process does not provide a true monocrystalline silicon layer, but rather relatively small regions of single crystals having grain boundaries which have a deleterious effect on the electrical properties of the layer.

The prior art also shows techniques for bonding semiconductor wafers together, for example for use in a process for forming dielectrically isolated devices. Such prior art includes "Improved Dielectrically Isolated Device Integration by Silicon-Wafer Direct Bonding (SDB) Technique", Ohashi, et al., IEDM 86, pages 210-213; "1800V Bipolar-Mode MOSFET's: A First Application of Silicon Wafer Direct Bonding (SDB) Technique to a Power Device", Nakagawa et al., IEDM 86, page 122-125; and "A Field-Assisted Bonding Process for Silicon Dielectric Isolation", Frye et al., J. of Electrochem. Society: Solid-State Sci. and Tech., Vol. 133, No., August 1986, pages 1673-1677.

It has been recognized that it is useful to allow the formation of a semiconductor device having a plurality of electrically isolated islands, while still including a portion of the semiconductor which is electrically connected to the substrate. This is described, for example, in "Dielectrically Isolated Intelligent Power Switch", Y. Ohata and T. Izumita, Proceedings of the IEEE 1987 Custom Integrated Circuits Conference, May 1987, pages 443-446.

SUMMARY

In accordance with the teachings of this invention, a novel process and structure is taught which provides discrete semiconductor islands located in a semiconductor substrate, the islands being electrically isolated from each other. Certain of these are islands, in addition to being electrically isolated from other islands, are also electrically isolated from the substrate. Yet other ones of these islands are electrically isolated from other islands, but are electrically connected to the substrate. This has the advantage of providing discrete semiconductor islands within which can be formed individual electrical circuits which are electrically isolated from each other and from the substrate, and yet provide one or more regions wherein a large device, such as a power transistor, for example, can be formed which is electrically connected to the substrate. This allows the substrate to serve as a current flow path for this large device, allowing sensitive analog and/or digital sense and control circuitry, for example, to be contained in the same integrated circuit as one or more power devices, such as transistors, SCRs, or the like, while preventing the electrical characteristics of such control circuitry from being affected by the operation of the one or more power devices. Furthermore, using the substrate as a current flow path decreases the amount of surface area required for a given device as compared to the case where that current flow path must be connected to the top surface of the integrated circuit.

In accordance with the teachings of this invention, a substrate is used and a layer of electrical insulation is formed over only a portion of the surface of the substrate. Grooves are then formed to serve as vertical isolation regions. The grooves are filled with a non-conductive material, or covered with a layer of insulation on their sides and bottom, and filled with any convenient material, such as polycrystalline silicon. A second semiconductor substrate is then bonded to the first, and serves as the ultimate substrate of the finished device. The surface of the first substrate opposite said second substrate is etched to the vertical grooves, thereby providing a surface having vertical grooves serving as vertical isolation. The insulation layer formed on the surface of the first substrate serves as isolation between the islands and second substrate, while the absence of such insulation layer causes certain other islands to be electrically connected to the second substrate.

DETAILED DESCRIPTION

Figure 1A:
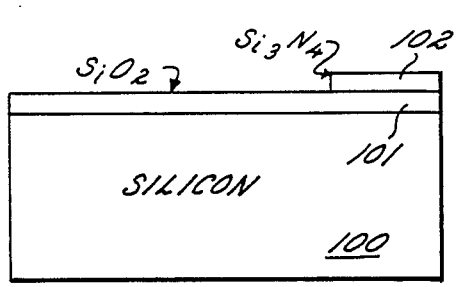
FIGS. 1a through 1h depict a process sequence of one embodiment of this invention.

As shown in FIG. 1a, a semiconductor substrate 100, for example of silicon, is used. A thin layer 101 of insulation is formed on one surface of substrate 100, for example, by thermal oxidation of substrate 100 to form silicon dioxide to a thickness of approximately 500–1000 Å. A thin layer of, for example, silicon nitride 102 is then formed on layer 101 to a thickness within the range of approximately 400–1200 Å, for example by low pressure chemical vapor deposition. A layer of photoresist (not shown) is then placed on layer 102 and patterned using suitable photolithographic techniques in order to expose that portion of silicon nitride layer 102 which is to be removed. Using an etch technique such as plasma etch, the exposed portion of silicon nitride layer 102 is removed, thereby exposing a portion of silicon dioxide layer 101. The remaining portions of silicon nitride layer 102 define where semiconductor islands will be formed which are electrically connected to the substrate. The remaining photoresist is then removed.

Figure 1B:
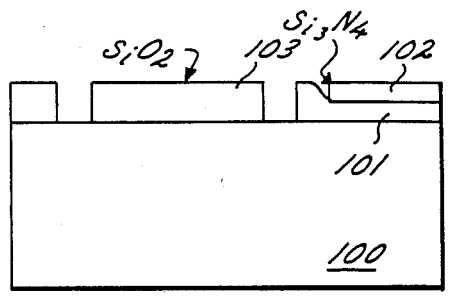

As shown in FIG. 1b, a thicker layer 103 of silicon dioxide is formed on the surface of the substrate 100 which is not covered by the remaining portion of silicon nitride layer 102. This thicker layer of silicon dioxide 103 is formed to a thickness of approximately 2000–20,000 Å, for example by thermal oxidation of substrate 100. A layer of photoresist (not shown) is then formed on the surface of the wafer (i.e., substrate 100 and any layers formed thereon), and patterned using suitable photolithographic techniques to expose that portion of silicon dioxide layer 103 where trenches are to be formed. The exposed portions of silicon dioxide layer 103 are then etched, for example using plasma etch.

Figure 1C:
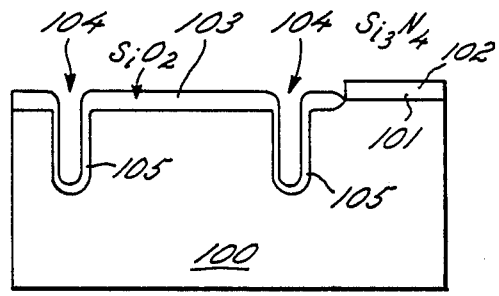

Referring to FIG. 1c, trenches 104 are then etched in substrate 100 to a depth within the range of approximately 5 μm to 40 μm, for example by reactive ion etching (RIE). The remaining portions of the photoresist are then removed. The width of trenches 104 is preferably within the range of approximately 2 μm to 6 μm.

Again referring to FIG. 1c, a layer of insulation 105 is formed on the sides and bottom of trenches 104. This is accomplished, for example, by thermally oxidizing the sides and bottom of trenches 104 to form a layer of silicon dioxide 105 to a thickness within the range of approximately 2000–20,000 Å.

Figure 1D:
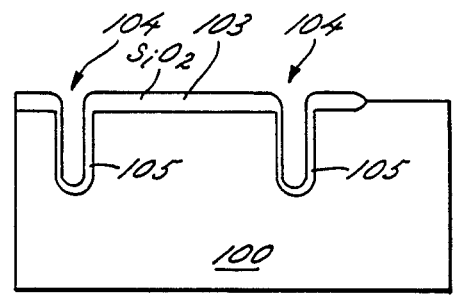

Referring now to FIG. 1d, the remaining portion of the silicon nitride layer 102 is then removed, for example by etching with phosphoric acid. This etchant does not significantly affect silicon dioxide layers 101, 103, or 105. A non-selective etch is then used to remove a thin layer of silicon dioxide 101 now exposed by the removal of the remaining portion of silicon nitride layer 102. A dilute buffered HF etch may be used advantageously for this purpose, although such etch will also etch slightly silicon dioxide layers 103 and 105. Therefore, it is important to ensure that such etching step is performed only so long as to completely remove silicon dioxide layer 101, thereby not significantly decreasing the thickness of silicon dioxide layers 103 and 105.

Figure 1E:
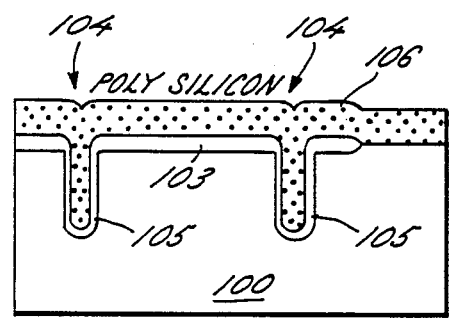

Referring to FIG. 1e, a layer of polycrystalline silicon is deposited on the wafer surface to a thickness of approximately 2 μm to 50 μm. Of importance, during this process polycrystalline silicon completely fills trenches 104, as well as forms a layer on the surface of the wafer. As shown in FIG. 1e, due to the presence of trenches 104 and silicon dioxide layer 103, the surface of polycrystalline silicon layer 106 may not be flat at this time.

Figure 1F:
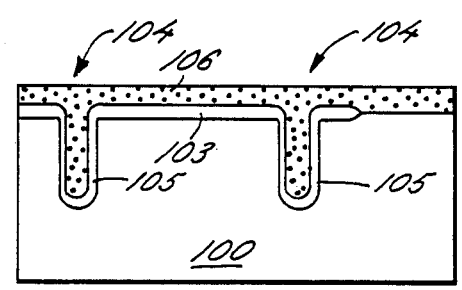

As shown in FIG. 1f, the surface of the wafer is then polished, for example by chem-mechanical polishing, in order to provide a smooth surface of polycrystalline silicon layer 106. At this time, the thickness of polycrystalline silicon layer 106 is approximately 1 μm to 49 μm.

Figure 1G:
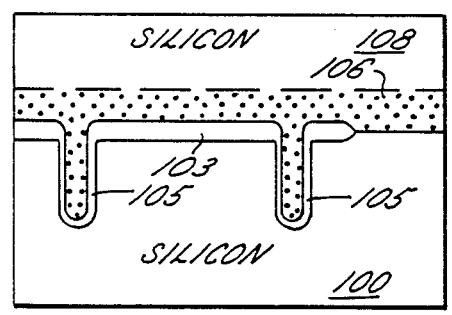

Referring now to FIG. 1g, a second silicon substrate 108 is attached to the wafer at the surface of polycrystalline silicon layer 106, for example using techniques taught in the prior art cited earlier in this specification.

Figure 1H:
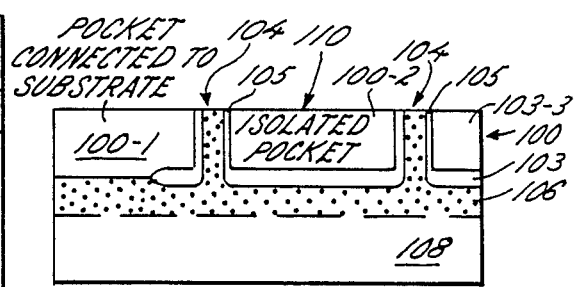

Referring to FIG. 1h, the structure is shown inverted from that of FIG. 1g, because substrate 108 is now serving as the lower portion of the wafer, and substrate 100 is serving as that portion of the wafer in which semiconductor devices are to be formed. As shown in FIG. 1h, substrate 100 is then thinned and polished to obtain a wafer ready for the formation of semiconductor components. This thinning and polishing operation is performed mechanically or chem-mechanically as is frequently done in the manufacture of conventional dielectrically isolated substrates. Following this thinning and polishing step, surface 110 of the wafer exposes a first pocket of 100-1 of semi-conductor material which is connected to substrate 108, since silicon dioxide layer 103 has been removed beneath pocket 100-1. Trench 104 separates pocket 100-1 from pocket 100-2, and silicon dioxide layers 105 separate the pockets from polycrystalline silicon 106 within trench 104. Pocket 100-2 is electrically isolated from substrate 108 by silicon dioxide layers 105 and 103. Pocket 100-3 is also shown being isolated from substrate 108 by silicon oxide layers 105 and 103. Naturally, although only three pockets, 100-1 through 100-3 are shown, this technique can be used for preparing a semiconductor wafer to include any number of pockets, including any desired number of such pockets being connected to substrate 108, and any number of pockets desired being isolated from substrate 108.

Figure 2A:
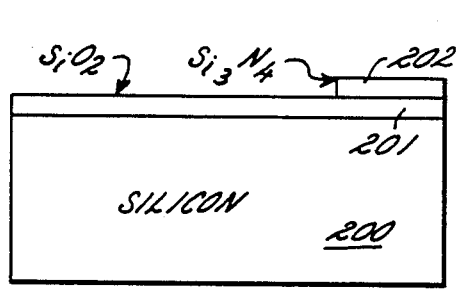
FIGS. 2a through 2g depict a process sequence of another embodiment of this invention.

Another example of a process suitable for use in accordance with the teaching of this invention is depicted in the cross-sectional views of FIGS. 2a–2g. As shown in FIG. 2a, a semiconductor substrate 200, for example of silicon, is used. A thin layer 201 of insulation is formed on one surface of substrate 200, for example, by thermal oxidation of substrate 200 to form silicon dioxide to a thickness of approximately 500–1000 Å. A thin layer of, for example, silicon nitride 202 is then formed on layer 201 to a thickness within the range of approximately 400–1200 Å, for example by low pressure chemical vapor deposition. A layer of photoresist (not shown) is then placed on layer 202 and patterned using suitable photolithographic techniques in order to expose that portion of silicon nitride layer 202 which is to be removed. Using an etch technique such as plasma etch, the exposed portion of silicon nitride layer 202 is removed, thereby exposing a portion of silicon dioxide layer 201. Portions of silicon nitride layer 202 remain where power devices are to be formed, i.e. where islands of semiconductor material are to be formed which are electrically connected to the substrate. The remaining photoresist is then removed.

Figure 2B:
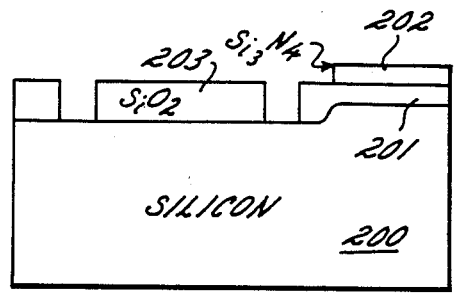

As shown in FIG. 2b, the exposed portion of silicon dioxide layer 201 is removed, for example, by using a plasma etch. The portion of substrate 200 which is now exposed is etched to any convenient depth (typically 0.5 $\mu$m to 1.0 $\mu$m) such that a silicon dioxide layer 203 is then formed to a sufficient thickness such that the top of silicon dioxide layer 201 and the top of silicon dioxide layer 203 are at approximately the same level. This oxidation step results in a silicon dioxide layer 203 being formed to a thickness of approximately 0.8 $\mu$m to 3.0 $\mu$m, for example, by thermal oxidation. Using suitable photolithographic and etching techniques, portions of silicon dioxide layer 203 are removed where vertical trenches are to be formed. Silicon dioxide layer 203 may be etched, for example, with plasma etching in order to form these openings.

Figure 2C:
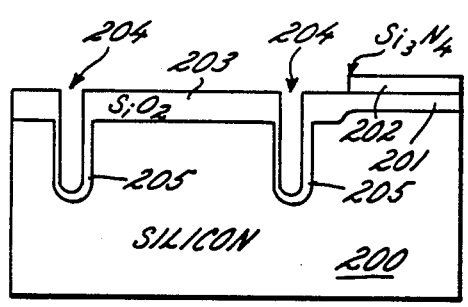

Referring to FIG. 2c, trenches 204 are then etched in substrate 200 to a depth within the range of approximately 5 $\mu$m to 40 $\mu$m, for example by reactive ion etching (RIE). The width of trenches 204 is preferably within the range of approximately 2 $\mu$m to 6 $\mu$m. A layer of insulation 205 is formed on the sides and bottom of trenches 204. This is accomplished, for example, by thermally oxidizing the sides and bottom of trenches 204 to form a layer of silicon dioxide 205 to a thickness within the range of approximately 2000–20,000 Å. During this oxidation step, the thickness of silicon dioxide layer 203 is increased slightly, and preferably such that its top surface is coplanar with the top surface of silicon dioxide layer 201.

Figure 2D:
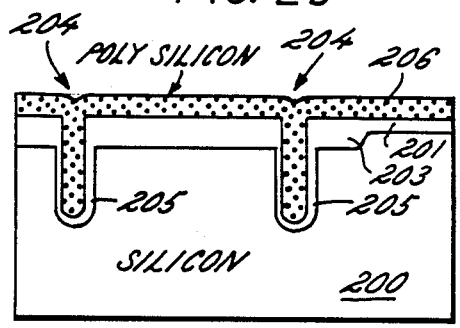
Figure 2E:
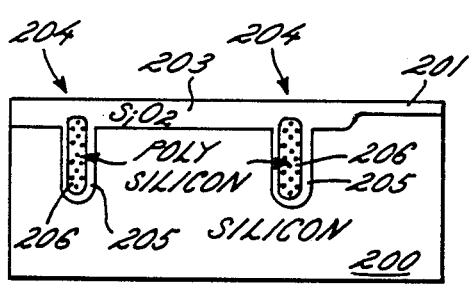

Referring now to FIG. 2d, the remaining portion of the silicon nitride layer 202 is then removed, for example by etching with phosphoric acid. This etchant does not significantly affect silicon dioxide layers 201, 203, or 205. A layer of polycrystalline silicon is now deposited on the wafer surface to a thickness of approximately 2 $\mu$m to 50 $\mu$m. Of importance, during this process, polycrystalline silicon completely fills trenches 204, as well as forms a layer on the surface of the wafer. As shown in FIG. 2e, due to the presence of trenches 204 and silicon dioxide layer 203, the surface of polycrystalline silicon layer 206 may not be flat at this time.

As shown in FIG. 2e, the portion of polycrystalline silicon layer 204 which is not contained within trenches 204 is then removed, for example, by using a plasma etch such that the surface of polycrystalline silicon 204 is etched below the surface of silicon dioxide layer 203. Next, the exposed portions of the polycrystalline silicon is oxidized, for example, for approximately 10–100 min. at approximately 900°–1100° C. in order to form a top surface of the wafer which is planar. The wafer is then etched to remove silicon dioxide layer 20, and then as shown in FIG. 2f, a second semiconductor wafer 208 is attached to the wafer at the surface of silicon dioxide layer 203, and the bare silicon surface formerly covered by silicon dioxide layer 201, for example by the techniques shown in the prior art cited earlier in this specification.

Figure 2F:
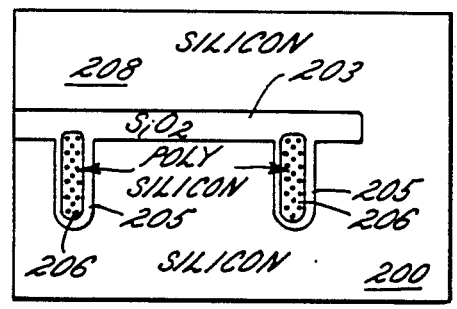
Figure 2G:
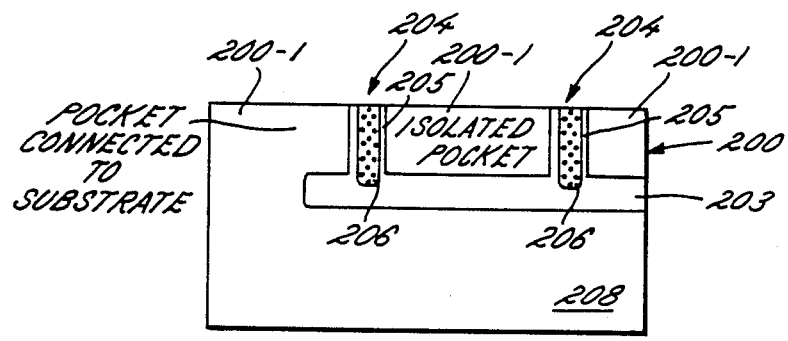

Referring to FIG. 2g, the structure is shown inverted from that of FIG. 2f, because substrate 208 is now serving as the lower portion of the wafer, and substrate 200 is serving as that portion of the wafer in which semiconductor devices are to be formed. As shown in FIG. 2g, substrate 200 is then thinned and polished to obtain a wafer ready for the formation of semiconductor components. This thinning and polishing operation is performed mechanically or chem-mechanically as is frequently done in the manufacture of conventional dielectrically isolated substrates. Following this thinning and polishing step, surface 210 of the wafer exposes a first pocket of 200-1 of semi-conductor material which is connected to substrate 208, since silicon dioxide layer 203 is not present beneath pocket 200-1. Trench 204 separates pocket 200-1 from pocket 200-2, and silicon dioxide layers 205 separate the pockets from polycrystalline silicon 206 within trench 204. Pocket 200-2 is electrically isolated from substrate 208 by silicon dioxide layers 205 and 203. Pocket 200-3 is also shown being isolated from substrate 208 by silicon oxide layers 205 and 203. Naturally, although only three pockets 200-1 through 200-3 are shown, this technique can be used for preparing a semiconductor wafer to include any number of pockets, including any desired number of such pockets being connected to substrate 208, and any number of pockets desired being isolated from substrate 208.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A method for forming a semiconductor device including a wafer having a top surface and a bottom surface and one or more regions of a first type formed within said wafer adjacent said top surface which are electrically isolated from said bottom surface of said wafer and one or more regions of a second type formed within said wafer adjacent said top surface which are electrically connected to said bottom surface of said wafer, said regions of said first type being electrically isolated from each other and from said regions of said second type, said regions of said first and second type being laterally displaced from one another, said method comprising the steps of:

forming a protective layer on the surface of a first substrate where said one or more regions of said first type are to be formed;

forming grooves in said first substrate surrounding areas in said first substrate where said regions of said first and second types are to be formed;

forming an insulating layer on the surface of said first substrate not covered by said protective layer and extending into said grooves;

attaching a second substrate to said layer on said first substrate; and removing the bottom portion of said first substrate to expose said insulating layer within said grooves.

2. A method as in claim 1 wherein said protective layer comprises an oxidation blocking material.

3. A method as in claim 2 wherein said protective layer comprises silicon nitride.

4. A method as in claim 3 wherein said insulating layer comprises an oxide of said first substrate.

5. A method as in claim 1 which further comprises the step of removing said protective layer prior to said step of attaching.

6. A method as in claim 1 wherein said insulating layer comprises an oxide of said first substrate.

7. A method as in claim 1, wherein said insulating layer within said grooves comprises a first layer of dielectric material covering the sides of said groove and a second layer of conductive material formed on said first layer of dielectric material.

8. A method as in claim 7 wherein said conducive material comprises polycrystalline silicon.

9. A method as in claim 7 wherein said second layer is formed over the entire top surface of the wafer.

10. A method as in claim 7 which further comprises the step of removing, except within said grooves, said layer of conductive material prior to said step of attaching.

11. A method as in claim 8 which further comprises the step of:
   oxidizing the top surface of said layer of conductive material prior to attaching said second substrate.

12. A method as in claim 11 wherein said oxide formed on the top surface of said layer of conductive material is diffused into said first and second substrates during or following said step of attachment.

* * * * *